US005185580A

United States Patent [19]

Nichols, III et al.

[11] Patent Number: 5,185,580
[45] Date of Patent: Feb. 9, 1993

[54] ELECTRICAL TRANSMISSION CABLE TERMINATION DEVICE HAVING SHORT AND OPEN-CIRCUIT CABLE TEST CAPABILITIES

[75] Inventors: Edward L. Nichols, III, Annapolis; Gary L. Stirk, Arnold, both of Md.

[73] Assignee: Smart House, L.P., Upper Marlboro, Md.

[21] Appl. No.: 754,758

[22] Filed: Sep. 4, 1991

[51] Int. Cl.⁵ ..................... G01R 31/02; H03H 7/38
[52] U.S. Cl. ................................... 324/539; 324/538; 333/130
[58] Field of Search ............... 324/508, 509, 525, 527, 324/537, 538, 539, 541, 549; 333/22 R, 32, 124, 130

[56] References Cited

U.S. PATENT DOCUMENTS 3,493,853  2/1970  Bellamy et al. ................ 324/525
3,728,616  4/1973  Cheek et al. .................... 324/538

Primary Examiner—Gerard R. Strecker
Assistant Examiner—Diep Do
Attorney, Agent, or Firm—Cushman, Darby & Cushman

[57] ABSTRACT

A electrical transmission line termination device capable of performing various termination requirements including matching the line impedance of wires in a transmission line with load impedances, electrically connecting conductors in a transmission line for maintaining electrical continuity, detecting improper wiring of the various wires in a transmission line, and connecting a cable shielding conductor to a ground wire.

16 Claims, 4 Drawing Sheets

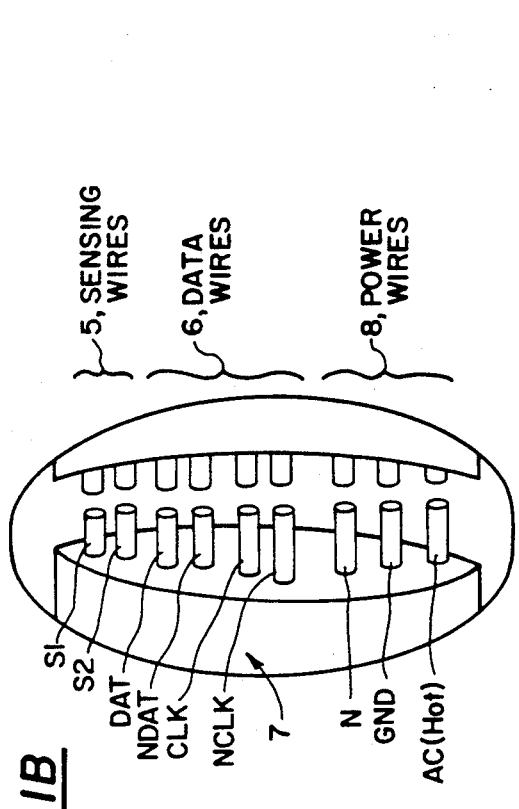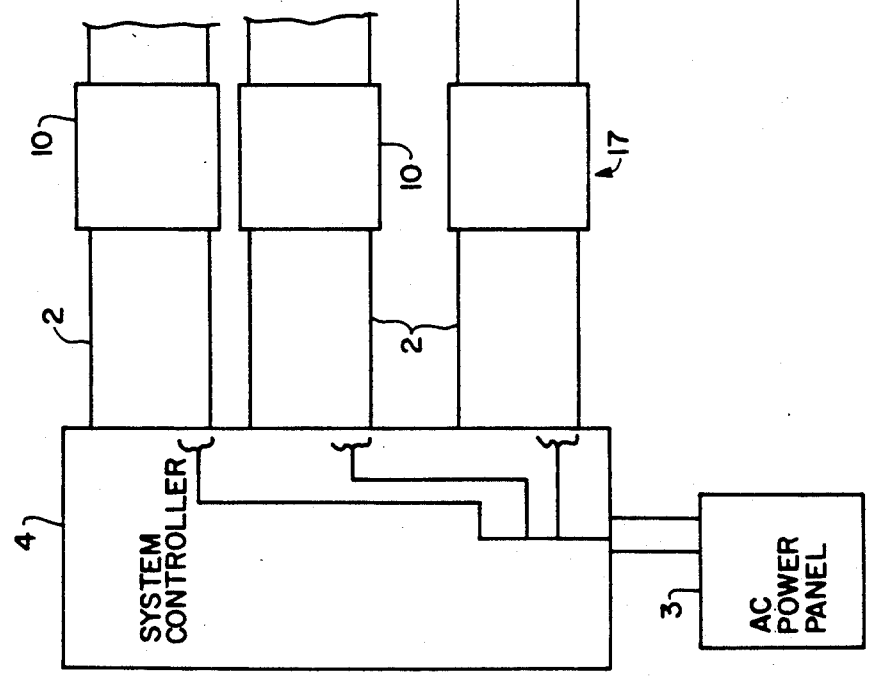
FIG. 1B
FIG. 1A

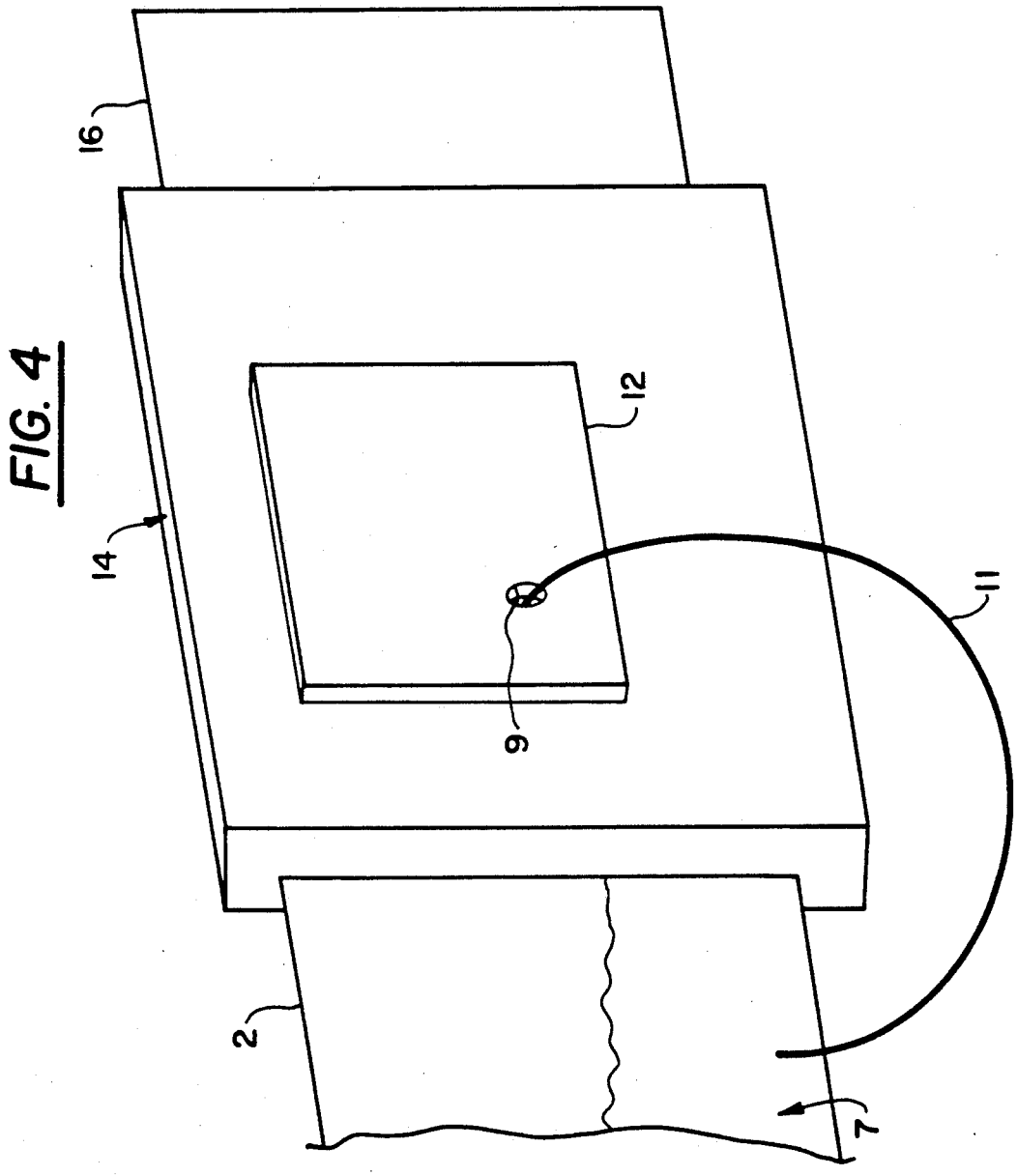

ELECTRICAL TRANSMISSION CABLE TERMINATION DEVICE HAVING SHORT AND OPEN-CIRCUIT CABLE TEST CAPABILITIES

BACKGROUND OF THE INVENTION

1. Field of the Invention

The present invention relates to an electrical transmission channel termination device for terminating an electrical transmission channel, and, more specifically, which provides a load impedance to a transmission line matching the line impedance, electrically connects conductors in a monitoring circuit to maintain circuit continuity for detection of incorrect wiring, provides circuits to automatically delete miswiring of AC circuit conductors and electrical short circuits in a transmission line, and provides access for a connection to ground for a conductive shield within a transmission channel.

2. Description of the Prior Art

Electrical transmission lines must be terminated in order for the transmission line to perform efficiently. Typically, an electrical transmission line is terminated using a termination device located at or near the end of the transmission line. In terminating an electrical transmission line it is often necessary to provide an impedance at the termination, referred to as a load impedance, which matches the impedance of the transmission line, or line impedance. Otherwise, a reflection of the transmitted signal back along the transmission line may result, causing communication errors. A typical function of a termination device would be to provide this load impedance. However, termination devices may serve other functions as well. These additional functions will depend on the requirements of the particular transmission line configuration being terminated.

Of particular interest with respect to the present invention is an electrical transmission cable configuration which consists of a single cable or channel containing both conductors which carry data and conductors which supply power. Such a cable may also include a conductor or a foil strip which serves as a shield, separating the power supplying conductors from the data carrying conductors. The shield, when grounded, shields the AC power lines from EMF emissions, which could interfere with other electrical devices, such as AM radios, which are also plugged into the AC power line. The EMF emissions may come from the data conductors and other sources. Such a cable is described in U.S. patent application Ser. No. 07/496,979 filed on Mar. 21, 1989.

Conversely, noise spikes that are present on the power AC conductors are shielded from interfering with data conductors. The invention utilizes the AC ground wire to ground the shield at both cable ends to provide a greater effective shield typically 5-6 db improvement, over grounding at one end only.

The transmission cable configuration described above requires a termination device which can perform several termination functions. Such a termination device was not previously known.

SUMMARY OF THE INVENTION

It is an object of the present invention to provide a termination device that provides a load impedance equal to the line impedance to minimize errors in data communication. It is another object of the present invention to provide a termination device that electrically connects sensing wires to maintain continuity of the transmission cable so that breaks can be detected. It is a further object of the present invention to provide means for a connection between the cable shield and the ground wire in the power transmission lines so that the cable shield may protect the AC wires in the cable from interference. It is a further object of the present invention to provide a termination device capable of detecting improper wiring or shorts occurring in the power wiring.

The electrical transmission cable termination device of the present invention meets the objects of the present invention discussed above by providing various circuits which perform the termination functions. The circuits may be combined on a single circuit board which is then attached to the transmission cable. In one circuit, passive circuit elements provide the load impedances which match the line impedances of the data communication lines. In a second circuit, a jumper connects the sensing lines to one another, which indicate that electrical continuity in the transmission cable is being maintained.

To detect any incorrect wiring of the AC wire, a load is provided between the ground wire and neutral wire. Should the AC and neutral wires be reversed anywhere on that branch, creating a potentially unsafe explosive of live AC at light fixture sockets and the like, this load will create a current sufficient to cause a ground fault circuit breaker to trip, thus cutting off power to that branch. In the event a data line or a shield wire is shorted across the AC wire or to ground, a load is also provided between each data line and ground, as well as between each shield wire and ground. This load will cause a circuit breaker to trip in the same manner as the load between neutral and ground, which was discussed above. To ground the channel shield, an access hole is provided which allows connection between the channel shield and the ground wire.

BRIEF DESCRIPTION OF THE DRAWINGS

These and other advantages of the present invention may be appreciated from studying the following detailed description of the preferred embodiment together with the drawings in which:

FIG. 1 is a functional diagram of an electrical transmission system incorporating the termination device of the present invention;

FIG. 4 is a perspective view illustrating the termination device of the present invention attached to a tap in an electrical transmission system.

DETAILED DESCRIPTION OF THE PREFERRED EMBODIMENT

Figure 2:
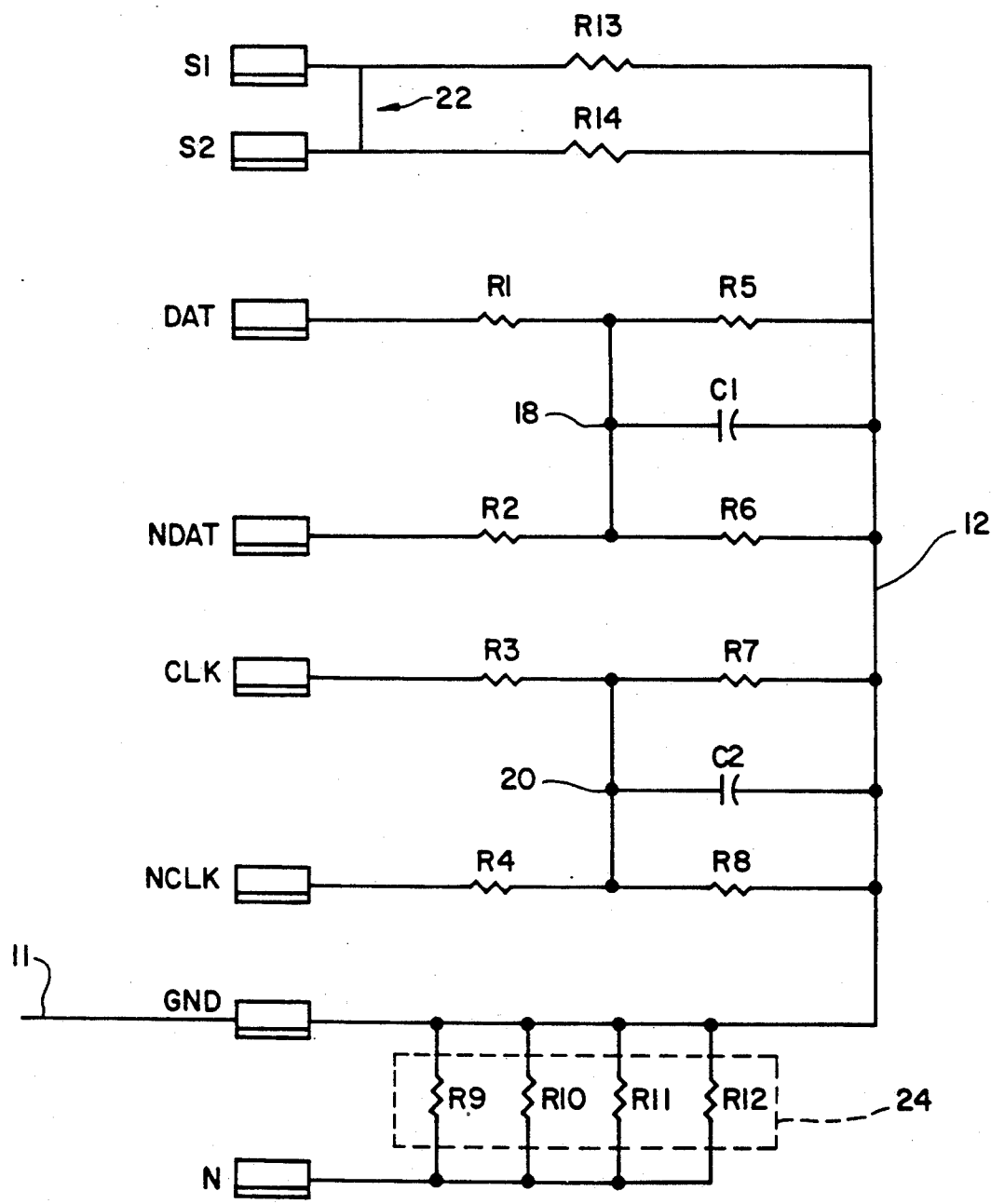
FIG. 2 is a schematic diagram of the preferred embodiment of the termination device of the present invention.

The present invention is particularly suited to use in the centralized power control system taught in U.S. Pat. No. 4,899,129 and further described in U.S. patent application Ser. No. 07/721,328, filed Jul. 1, 1991. Both of these applications are expressly incorporated by reference. The described control system uses transmission channels to supply power and data to appliances in a building. These transmission channels, referred to as branch channels, have termination requirements provided by the present invention.

In the described system there exists three pairs of data wires in a branch channel. One pair carries data signals, one pair carries clock signals, while the final pair, referred to as sensing wires, carries no signal but serves to shield the signal carrying data lines from one another. The present invention provides load impedances to match the line impedance of the data wires and the clock wires. The shield wires also act as a switch, informing the controller of the described system when a particular branch is present. Power and data are only provided to those branches recognized as being present. When the sensing wires are contacted together, a continuous circuit is formed. The controller of the described system then can detect this continuous circuit and, consequently, recognize that the branch is present. In the event the sensing wires lose their connection with one another, the circuit is broken and the controller no longer recognizes the existence of that branch.

The described controller also includes circuit breakers capable of tripping when a given current is detected in a branch. The present invention makes use of these circuit breakers to detect incorrect wiring and ground faults by providing a load between the transmission wires in the branch channel and ground. This load creates a current when a fault condition occurs in a branch channel, thereby tripping the circuit breakers in the controller.

FIG. 1 illustrates the present invention's inclusion in the control system described above. Branch channels formed of branch cables 2, extend from an AC power panel 3 and system controller 4 throughout a building. The present invention terminates each branch cable 2. The branch cables 2 carry data signals along data wires 6 to and from system controller 4 and AC power along power wires 8 to appliances from AC power panel 3. Taps 10 are provided along the length of each branch channel for attaching interfaces to the channels to which appliances are then connected. A branch cable 2, comprises two pairs of data wires 6, one pair of sensing wires 5, and three individual power wires 8. The power wires consist of an AC wire, AC (hot); a ground wire, GND; and a neutral wire, N. The transmission channel termination device 12 of the present convention attaches to the branch channels at or near the end of each channel. The termination device 12 may be configured such that the circuit board is easily mounted to a final tap 14 located at or near the end 16 of each branch channel 2.

Figure 3:
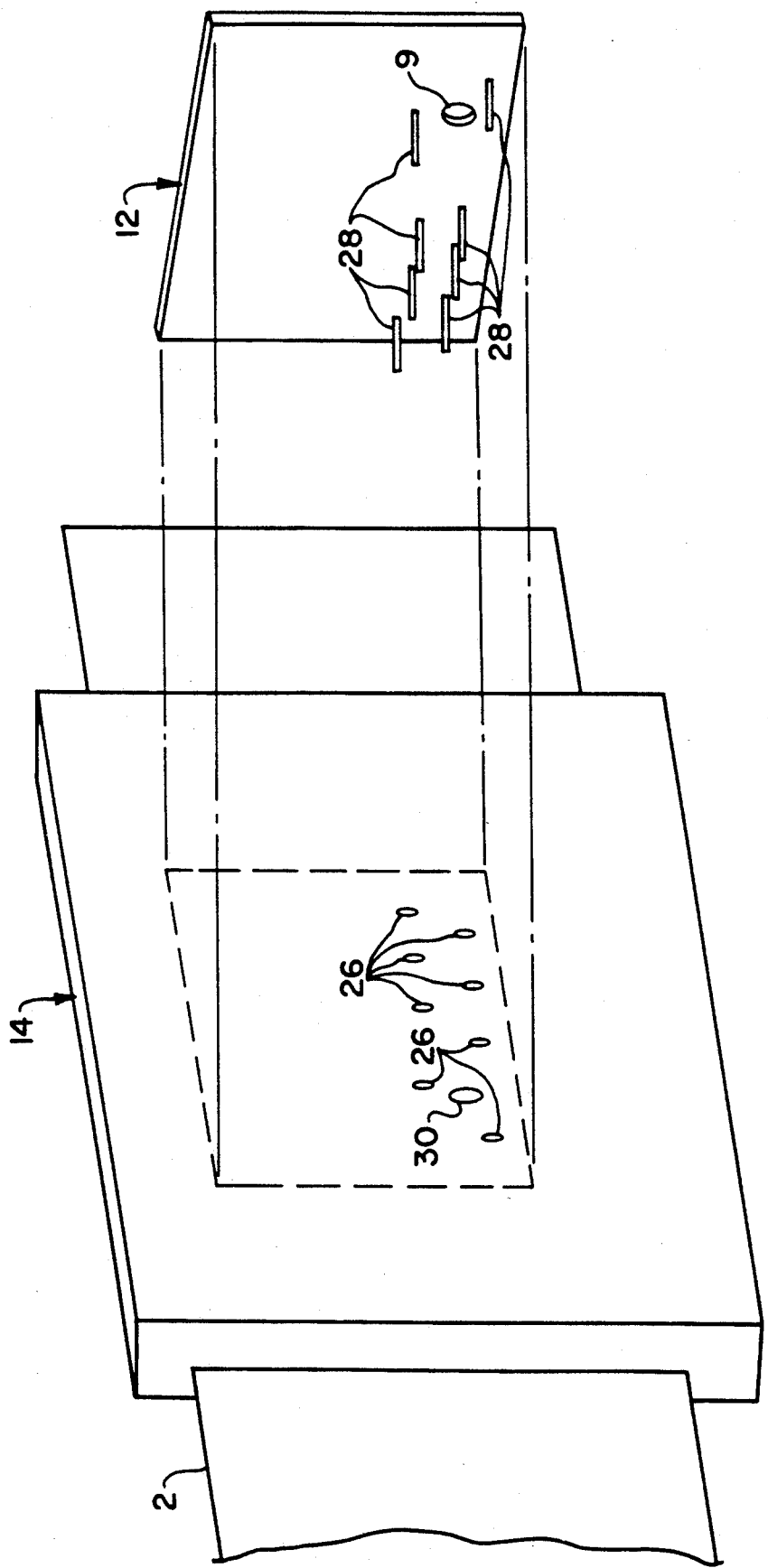
FIG. 3 is a perspective view illustrating the manner in which the termination device of the present invention connects to a tap in an electrical transmission channel system.

Referring to FIG. 3, which illustrates in perspective view the attachment of the termination device 12 to the final tap 14, each tap 10 and 14 provides electrical connections between the tap outlets 26 and a single corresponding conductor in the branch cable 2. Pins 28 are connected to the various circuits of the termination device of the present invention. The pins 28 are positioned such that they are insertable into the tap outlets 26, creating an electrical contact between each pin 28 and single corresponding conductor in the cable 2. The dotted lines in FIG. 3 represent the manner in which the termination device of the present invention is placed on the final tap 14. Additionally a hole 9 is provided in the circuit board of the termination device of the present invention. The hole 9 is aligned with the ground tap position 30 on the final tap 14. The purpose for the hole 9 is discussed in detail below. The operation of the termination device 12 is not effected by a short excess length of branch cable 2 which extends beyond the final tap 14, provided this excess length does not exceed several feet.

The data wires 6 in a branch cable consist of these pairs of wires. One pair carries data signals, DAT and NDAT. The second pair carries clock signals, CLK and NCLK. The frequency of these signals range from 50 kHz to 250 kHz. The data wires, DAT and NDAT, and the clock wires, CLK and NCLK, must be terminated in such a way that the load impedance matches the line impedance.

The transmission channel termination circuits of the present invention will be described in detail with reference to FIG. 2, which is a schematic diagram a single termination device according to the preferred embodiment of the present invention. Resistor R1 is connected to the data wire, DAT and a node, 18. Resistor R2 is connected to the not data wire NDAT and node 18. Resistors R1 and R2 provide the load impedance which matches the line impedance of the data wire DAT and the not data wire NDAT, respectively. Resistor R3 is connected to the clock wire, CLK and a node, 20. Resistor R4 is connected to the not clock wire NCLK and node 20. Resistors R3 and R4 provide the load impedance which matches the line impedance of the clock wire CLK and the not clock wire NCLK, respectively.

Due to the fact that the data wires are differentially driven, a zero voltage should appear at node 18 when the data wires are connected together in the termination circuit. Similarly, a zero voltage should appear at node 20 when the clock wires are connected together in the termination circuit. However, capacitor C1 may be provided between node 18 and the ground wire GND to null out any imbalances in the data wires. Capacitor C2 may also be provided between node 20 and the ground wire GND to null out any imbalances in the clock wires.

The pair of sense wires 5, further labeled the sense wires S1 and S2, do not carry any signal. The sense wires are disposed between the AC power and data wires to serve as a shield for the data wires by blocking electromagnetic radiation from the data wires. The sense wires also provide the basis for the system controller's ability to recognize that a branch is present. The present invention provides a jumper 22 between the two sense lines S1 and S2, which electrically connects the sense lines S1 and S2 together. By connecting S1 and S2 with a jumper 22, electrical continuity is maintained between S1 and S2. The system controller can check for electrical continuity in the shield lines by, for example, sending a signal through S1 and checking for its return through S2. If a signal is received, the controller recognizes the branch as attached to its system and that there are no breaks in that particular branch.

As shown in FIG. 2, a load 24, which is represented by the dotted lines, is provided between the neutral wire N and ground wire GND to detect incorrect wiring of the AC power wire (not shown) in the branch. In the event the AC (hot) wire and the neutral wire have been switched anywhere in a branch, load 24 would produce a ground fault cement causing a ground fault circuit breaker in the system controller 4 to trip, thereby electrically disconnecting the branch.

Load 24 consists of four resistors R9, R10, R11 and R12 in a parallel connection between the neutral wire N and the ground wire GND. Together R9, R10, R11, and R12 provide the preferred 2,700 ohm load to cause the ground fault circuit breaker to trip.

Referring again to FIG. 2, resistors R5 and R6 are connected in parallel between node 18 and the ground wire GND to detect shorts to ground and shorts to the AC (hot) wire of the data wires DAT and NDAT by accidental penetration by a nail during installation, for example. Should either of the data wires, DAT or NDAT, have a short to ground or a short to the AC (hot) wire, a voltage would be created at node 18 across the parallel resistors R5 and R6. This creates a current in the data wires sufficient to cause a circuit breaker (not shown) in the system controller 4 to trip. Resistors R7 and R8, connected in parallel between node 20 and ground, causes the same effect in the clock wires, CLK and NCLK, if either of the clock wires, CLK or NCLK, are shorted to ground or to the AC (hot) wire. In this way, the present invention detects faulty wiring, such as a short to ground or the AC (hot) wire, of the data wires and clock wires.

As an added feature of the present invention, resistors R13 and R14 may be connected in parallel between the jumper 22 and the ground wire GND to detect electrical shorts between the sense wires and the AC (hot) wire, as shown in FIG. 2. Such a short would create a voltage across R13 and R14, thereby creating a current capable of a tripping circuit breaker (not shown) in the system controller 4.

FIGS. 3 and 4 illustrate the termination device of the present invention 12 attached to the final tap position 14 and the manner in which this is accomplished. An additional feature of the termination device of the present invention is that access is provided to the ground wire GND in the branch cable 2 so that the cable shield 7, which protects the data wires 6 and power conductors 8 from electromagnetic emissions of the external environment and each other, may be directly attached to a low resistance ground, thereby improving the effectiveness of the cable shield. As illustrated in FIGS. 3 and 4, a hole 9, aligned with the ground tap position 30, allows an insulated wire 11 to be inserted through the termination device 12 and into the ground tap position 30. The insulated wire II, referred to as a cable shield grounding wire, is equipped with a blade end (not shown), which is inserted through the hole 9 in the circuit board of the termination device 12 and into the ground tap position 30 of the final tap 14. The other end of the cable shield grounding wire 11 is stripped and tinned and attached to the cable shield 7 using standard termination technology.

In an alternate embodiment, a termination device of the present invention is additionally located at the drive end 17 of each branch cable 2 to provide further reduction of noise and interference in the transmission channels. When used at the drive end 17 of a transmission channel, only the load impedance resistors R1, R2, R3, and R4, as shown in FIG. 2, are necessary. The connections of R1, R2, R3, and R4 to the data and clock lines at the drive end 17 are identical to those previously described when the termination device is located at the end 16 of the channel. However, it is possible to include the impedance matching resistors R1, R2, R3, and R4 within the circuitry of the system controller, rather than in a separate circuit, thereby eliminating the need for an additional tap 17 for the termination device 12 at the beginning of the branch channel.

Below is a table containing the values of the circuit components as disclosed in the preferred embodiment.

| Component | Value |
| --- | --- |
| Capacitors C1 and C2 | 0.022 micro Farads |
| Resistors R1, R2, R3, and R4 | 90 ohms each |
| Resistors R5, R6, R7, R8, R13, and R14 | 5,600 ohms each |
| Resistors R9 and R10 | 10,000 ohms each |
| Resistors R11 and R12 | 12,000 ohms each |

While the present preferred embodiment of the invention has been shown and described, it is to be distinctly understood that the invention is not limited thereto but may be otherwise variously embodied within the scope of the following claims.

I claim:

1. An electrical transmission cable termination device for terminating an electrical transmission cable, said electrical transmission cable including a pair of data wires, a pair of clock wires, a pair of sense wires, a metallic foil shield, a ground wire, a neutral wire, an AC-hot wire, and having a non-terminated end adapted to be fed by signals from a controller, which controller also includes a circuit breaker, comprising:
   an impedance matching means for providing load impedances substantially respectively matching a line impedance of said pair of data wires and said pair of clock wires in said transmission cable;
   a short circuit detecting means for detecting faulty wiring of said transmission cable, said short circuit detecting means including a load between various wires which transmit electrical signals in said transmission cable and said ground wire, said load creating a circuit breaker triggering current in said circuit breaker of said controller should a faulty wiring condition exist; and
   an electrical connecting means for providing an electrical contact between said pair of sense wires in said transmission cable, said connecting means usable to carry out a continuity check to detect breaks in said sense wires of said transmission cable upon application of a continuity check signal from said controller to one of said 2. An electrical transmission cable termination device as in claim 1 wherein said impedance matching means comprises:
   a first resistor having a first end and a second end, said first end connected to a first data wire in said pair of data wires;
   a second resistor having a first end connected to a second data wire in said pair of data wires, and a second end connected to said second end of said first resistor;
   a third resistor having a first end and a second end, said first end connected to a first clock wire in said pair of clock wires; and
   a fourth resistor having a first end connected to a second clock wire in said pair of clock wires, and a second end connected to said second end of said third resistor.

3. An electrical transmission cable termination device as in claim 2, wherein said short circuit detecting means comprises:
   a first impedance applied between said neutral wire and said ground wire for creating a current capable of tripping a circuit breaker in the event said AC wire has been switched with said neutral wire.

4. An electrical transmission cable termination device as in claim 3, wherein said first impedance includes a plurality of resistors in parallel connected between said neutral wire and said ground wire.

5. An electrical transmission cable termination device as in claim 3, wherein said short circuit detecting means further comprises:
- a second impedance connected between said second end of said first resistor and said ground wire for creating a current capable of tripping a circuit breaker should a short occur in said pair of data wires;
- a third impedance connected between said second end of said third resistor and ground for creating a current capable of tripping a circuit breaker should a short occur in said pair of clock wires.

6. An electrical transmission cable termination device as in claim 5, wherein said second impedance includes two resistors in parallel connected between said second end of said first resistor and said ground wire, and said third impedance includes two resisters in parallel connected between said second end of said third resistor and said ground wire.

7. An electrical transmission cable termination device as in claim 5, wherein said short circuit detecting means further comprises a fourth impedance connected between said electrical connecting means connecting said pair of sense wires and said ground wire.

8. An electrical transmission cable termination device as in claim 7, wherein said fourth impedance includes two resisters in parallel connected between said electrical connecting means connecting said pair of sense wire and said ground wire.

9. An electrical transmission cable termination device as in claim 5, wherein said impedance matching means further comprises:
- a first capacitor having a first end connected to said second end of said first resistor, and a second end connected to said ground wire; and
- a second capacitor having a first end connected to said second end of said third resistor, and a second end connected to said ground wire.

10. An electrical transmission cable termination device as in claim 5, wherein said impedance matching means further comprises
- a fifth impedance attached to a drive end of said transmission cable between said first data wire and said second data wire; and
- a sixth impedance attached to a drive end of said transmission cable between said first clock wire and said second clock wire.

11. An electrical transmission cable termination device as in claim 10, wherein said fifth impedance comprises:
- a fifth resistor having a first end connected to said first data wire and a second end connected to said ground wire; and
- a sixth resistor having a first end connected to said second data wire and a second end connected to said second end of said fifth resistor.

12. An electrical transmission cable termination device as in claim 11, wherein said sixth impedance comprises:
- a seventh resistor having a first end connected to said first clock wire and a second end connected to said ground wire; and
- an eighth resistor having a first end connected to said second clock wire and a second end connected to said second end of said seventh resistor.

13. An electrical transmission cable termination device insertable into a tap capable of providing an electrical connection to each wire in an electrical transmission cable for terminating said electrical transmission cable, said electrical transmission cable including a pair of data wires, a pair of clock wires, a pair of sense wires, a ground wire, a neutral wire, an AC hot wire, a conductive shield, and having a non-terminated end adapted to be fed by signals from a controller, which controller also includes a circuit breaker, comprising:
- an impedance matching means for providing load impedances substantially respectively matching a line impedance of said pair of data wires and said pair of clock wires in said transmission cable;
- a short circuit detecting means for detecting faulty wiring of said transmission cable, said short circuit detecting means including a load between various wires which transmit electrical signals in said transmission cable and said ground wire, said load creating a circuit breaker triggering current in said circuit breaker of said controller should a faulty wiring condition exist;
- electrical connecting means for providing an electrical contact between said pair of sense wires in said transmission channel, said connecting means useable to carry out a continuity check to detect breaks in said sense wires of said transmission cable upon application of a continuity check signal to one of said sense wires; and
- a cable shield grounding means for connecting said conductive shield to said ground wire.

14. An electrical transmission cable termination device as in claim 13, wherein said cable shield grounding means comprises:
- an insulated wire having a first end and a second end, said first end having a blade for inserting said first end into a said cable termination device and into contact with said ground wire, said second end being stripped and tinned for connecting said second end to said cable shield.

15. An electrical transmission cable termination device as in claim 14, further comprising:
- a single printed circuit board upon which said impedance matching means, said short circuit detecting means, and said electrical connecting means are packaged; and
- a plurality of pins mounted on said single printed circuit board, said pins providing an electrical connection for said impedance matching means, said short circuit detecting means, and said electrical connecting means, said pins also being aligned with and insertable into predetermined electrical contacts located on said taps and electrically connected to said wires of said transmission cable.

16. An electrical transmission cable termination device as in claim 15, wherein said short circuit detecting means includes a plurality of resistors in parallel formed on said single printed circuit board.

* * * * *